United States Patent
Lee et al.

(10) Patent No.: US 9,562,123 B2
(45) Date of Patent: Feb. 7, 2017

(54) PHOTOCURABLE COMPOSITION, BARRIER LAYER INCLUDING SAME, AND ENCAPSULATED DEVICE INCLUDING SAME

(71) Applicants: Chang Min Lee, Uiwang-si (KR); Seung Jib Choi, Uiwang-si (KR); Ji Hye Kwon, Uiwang-si (KR); Yeon Soo Lee, Uiwang-si (KR); Kyoung Jin Ha, Uiwang-si (KR)

(72) Inventors: Chang Min Lee, Uiwang-si (KR); Seung Jib Choi, Uiwang-si (KR); Ji Hye Kwon, Uiwang-si (KR); Yeon Soo Lee, Uiwang-si (KR); Kyoung Jin Ha, Uiwang-si (KR)

(73) Assignee: Cheil Industries, Inc., Gumi-Si, Kyeongsangbuk (KR)

( * ) Notice: Subject to any disclaimer, the term of this patent is extended or adjusted under 35 U.S.C. 154(b) by 168 days.

(21) Appl. No.: 14/385,920

(22) PCT Filed: Feb. 22, 2013

(86) PCT No.: PCT/KR2013/001423
§ 371 (c)(1),
(2) Date: Sep. 17, 2014

(87) PCT Pub. No.: WO2013/187577
PCT Pub. Date: Dec. 19, 2013

(65) Prior Publication Data
US 2015/0079332 A1    Mar. 19, 2015

(30) Foreign Application Priority Data

Jun. 15, 2012 (KR) .................. 10-2012-0064371
Jan. 14, 2013 (KR) .................. 10-2013-0004179

(51) Int. Cl.
*C08F 222/10* (2006.01)
*C08L 83/08* (2006.01)
*C09D 133/00* (2006.01)
*C08L 33/00* (2006.01)
*C08G 77/14* (2006.01)
*C08G 77/20* (2006.01)
*H01L 51/44* (2006.01)
*H01L 51/52* (2006.01)

(52) U.S. Cl.
CPC .............. *C08F 222/10* (2013.01); *C08L 33/00* (2013.01); *C08L 83/08* (2013.01); *C09D 133/00* (2013.01);
(Continued)

(58) Field of Classification Search
CPC .......... C08F 222/10; C08L 33/00; C08L 83/08
(Continued)

(56) References Cited

U.S. PATENT DOCUMENTS 7,297,460 B2    11/2007   Vanmaele et al.
2008/0234436 A1  9/2008   Sakamoto et al.
2009/0192282 A1  7/2009   Janvikul et al.

FOREIGN PATENT DOCUMENTS

DE    WO 0038619 A2 *  7/2000 ............. A61K 6/083
EP    2199346 A2       6/2010
(Continued)

OTHER PUBLICATIONS

Search Report dated Oct. 13, 2015 in corresponding European Patent Application No. 13804640.4.
(Continued)

*Primary Examiner* — Brent O'Hern
(74) *Attorney, Agent, or Firm* — Lee & Morse, P.C.

(57) ABSTRACT

The present invention relates to a photocurable composition, to a barrier layer including same, and to an encapsulated device including same, wherein the composition comprises a photocurable monomer(A) and a silicon containing monomer(B), wherein the silicon containing monomers(B) has a structure according to Formula 1.

15 Claims, 1 Drawing Sheet

(52) U.S. Cl.
CPC ............... *C08G 77/14* (2013.01); *C08G 77/20* (2013.01); *H01L 51/448* (2013.01); *H01L 51/5253* (2013.01); *Y10T 428/239* (2015.01)

(58) Field of Classification Search
USPC .......................... 428/76; 252/183.11; 522/64
See application file for complete search history.

(56) References Cited

FOREIGN PATENT DOCUMENTS

| | | |
|---|---|---|
| JP | 2010-006970 A | 1/2010 |
| JP | 2011-200780 A | 10/2011 |
| KR | 10-2006-0084978 A | 7/2006 |
| KR | 10-2008-0091368 A | 10/2008 |
| KR | 10-2011-0001884 A | 1/2011 |
| KR | 10-2011-0072930 A | 6/2011 |
| KR | 10-2011-0072930 A | 6/2011 |
| KR | 20110072930 A * | 6/2011 |
| WO | WO 00/38619 A2 | 7/2000 |

OTHER PUBLICATIONS

Office Action mailed Aug. 7, 2015 in corresponding Korean Patent Application No. 10-2013-0004179.
International Search Report dated Jun. 21, 2013 in corresponding International Application No. PCT/KR2013/001423.
Office Action mailed Jun. 26, 2014 in corresponding Taiwanese Patent Application No. 102115418.

\* cited by examiner

PHOTOCURABLE COMPOSITION, BARRIER LAYER INCLUDING SAME, AND ENCAPSULATED DEVICE INCLUDING SAME

TECHNICAL FIELD

The present invention relates to a photocurable composition, a barrier layer including the same, a barrier stack including the same, an encapsulated apparatus including the same, and a method for encapsulating the apparatus using the same.

BACKGROUND ART

Organic light emitting diodes (OLED) refer to a structure in which a functional organic material layer is inserted between an anode and a cathode, wherein an exciton having high energy can be created by recombination of a hole injected into the cathode and an electron injected into the anode. The created exciton may move in a ground state, thereby emitting light within a specific wavelength band. The organic light emitting diodes have various merits such as self-luminance, fast response, wide viewing angle, ultra-thinness, high definition and durability.

However, organic light emitting diodes have problems in that, due to moisture or oxygen flowing from outside or outgases generated inside or outside of the light emitting diodes despite sealing, thus organic materials and/or electrode materials can be oxidized, causing deterioration in the performance and lifespan thereof. In order to overcome such problems, some methods have been proposed, such as coating with a photocurable sealing agent, attachment of a transparent or opaque moisture absorbent, or provision of frits to a substrate on which an organic light emitting diode is formed.

For instance, Korean Publication No. 2006-0084978A has disclosed an encapsulated structure of organic light emitting diode devices, which includes a protective member for sealing formed by any one of moisture penetration inhibiting materials among silicone compounds and polymer resins.

DISCLOSURE

Technical Problem

It is one aspect of the present invention to provide a photocurable composition realizing a layer, the water vapor transmission rate and outgas generation amount of which are remarkably reduced after curing the composition.

It is another aspect of the present invention to provide a photocurable composition having a high photocuring rate, thus curing shrinkage stress after curing is low, thereby realizing layers not generating any shift.

It is a further aspect of the present invention to provide a photocurable composition realizing a layer, ensuring a very long lifespan of the member for the apparatus, when applied to encapsulate the member for the apparatus.

It is yet another aspect of the present invention to provide an apparatus comprising a layer formed using the photocurable composition.

Technical Solution

In accordance with one aspect of the present invention, a photocurable composition may include: (A) a photocurable monomer and (B) a silicon containing monomer, wherein the (B) silicon containing monomer may be represented by Formula 1:

<Formula 1> wherein $X_1$, $X_2$ and $X_3$ are the same or different and are O, S, NH or NR', R' is an unsubstituted or substituted C1-C20 alkyl group, $R_1$, $R_2$ and $R_3$ are the same or different and are an unsubstituted or substituted C1-C30 alkyl group, an unsubstituted or substituted C1-C30 alkylether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, or an unsubstituted or substituted C7-C30 arylalkoxy group, $Z_1$, $Z_2$, and $Z_3$ are the same or different and independently are hydrogen, an unsubstituted or substituted C1-C30 alkyl group, an unsubstituted or substituted C1-C30 alkylether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, an unsubstituted or substituted C7-C30 arylalkoxy group, or a group represented by Formula 2, <Formula 2> wherein * represents a binding site for Si in Formula 1, $R_4$ is hydrogen, or a substituted or unsubstituted C1-C30 alkyl group, $R_5$ is a substituted or unsubstituted C1-C30 alkylene group, a substituted or unsubstituted C6-C30 arylene group, a substituted or unsubstituted C7-C30 arylalkylene group or a substituted or unsubstituted C1-C30 alkyleneoxy group, n is an integer from 1 to 30, and at least one of $Z_1$, $Z_2$, and $Z_3$ is the group represented by Formula 2.

In accordance with another aspect of the present invention, a barrier layer may include a cured product prepared from the photocurable composition.

In accordance with a further aspect of the present invention, an encapsulated apparatus may include a substrate, a member for the apparatus formed on the substrate, and a barrier stack formed on the member for the apparatus and including an inorganic barrier layer and an organic barrier layer, wherein the organic barrier layer has an outgas generation amount of about 1000 ppm or less.

In accordance with yet another aspect of the present invention, an encapsulated apparatus may include a substrate, a member for the apparatus formed on the substrate, and a barrier stack formed on the member for the apparatus and including an inorganic barrier layer and an organic barrier layer, wherein the organic barrier layer has a water vapor transmission rate of about 4.5 g/m²·24 hr or less, as measured at 37.8° C. and 100% relative humidity for 24 hours at a layer thickness of the organic barrier layer of 5 μm.

Advantageous Effects

The present invention provided a photocurable composition realizing a layer, the water vapor transmission rate and outgas generation amount of which are remarkably reduced after curing the composition, and realizing a layer ensuring a very long lifespan of a member for an apparatus, when applied to encapsulate the member for the apparatus.

The present invention provided a photocurable composition having a high photocuring rate, thus curing shrinkage stress after curing is low, thereby realizing layers not generating any shift.

BEST MODE

Unless otherwise stated, the term "substituted" as used herein means that at least one hydrogen atom among functional groups of the present invention is substituted with a halogen (F, Cl, Br or I), a hydroxyl group, a nitro group, a cyano group, an imino group (=NH, =NR, wherein R is a C1-C10 alkyl group), an amino group [—NH$_2$, —NH(R'), —N(R") (R'"), wherein R', R" and R'" are each independently a C1-C10 alkyl group], an amidino group, a hydrazine or a hydrazone group, a carboxy group, a substituted or unsubstituted C1-C20 alkyl group, a substituted or unsubstituted C6-C30 aryl group, a substituted or unsubstituted C3-C30 cycloalkyl group, a substituted or unsubstituted C3-C30 heteroaryl group, or a substituted or unsubstituted C2-C30 heterocycloalkyl group.

The term 'hetero' as used herein means that a carbon atom is substituted with an atom selected from the group consisting of N, O, S and P.

The symbol '*' as used herein is a binding site of elements.

An aspect of the present invention relates to a photocurable composition including (A) a photocurable monomer, and (B) a silicon containing monomer.

(A) Photocurable Monomer

The photocurable monomer refers to a non-silicon type photocurable monomer which does not contain silicon and has one or more photocurable functional groups (such as a (meth)acrylate group, a vinyl group, and the like).

The photocurable monomer may include a monofunctional monomer, a polyfunctional monomer, and mixtures thereof. The photocurable monomer may include monomers having about 1 to 30, preferably about 1 to 20, more preferably about 1 to 6 photocurable functional groups such as a substituted or unsubstituted vinyl group, an acrylate group, or a methacrylate group.

The photocurable monomer may include a mixture of a monofunctional monomer and a polyfunctional monomer. In the mixture, the monofunctional monomer: polyfunctional monomer may be present in a weight ratio from about 1:0.1 to 1:10, preferably about 1:2 to 1:3.75.

Examples of the photocurable monomer may include a C6-C20 aromatic compound having a substituted or unsubstituted vinyl group; an unsaturated carboxylic acid ester having a C1-C20 alkyl group, a C3-C20 cycloalkyl group, a C6-C20 aromatic group, or a hydroxyl group and a C1-C20 alkyl group; an unsaturated carboxylic acid ester having a C1-C20 amino alkyl group; a vinyl ester of a C1-C20 saturated or unsaturated carboxylic acid; a C1-C20 unsaturated carboxylic acid glycidyl ester; a vinyl cyanide compound; an unsaturated amide compound; a monofunctional or polyfunctional (meth)acrylate of a monoalcohol or a polyhydric alcohol, and the like.

Examples of the photocurable monomer may include a C6-C20 aromatic compound having an alkenyl group including a vinyl group such as styrene, α-methyl styrene, vinyl toluene, vinyl benzyl ether, vinyl benzyl methyl ether, and the like; an unsaturated carboxylic acid ester such as methyl (meth)acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth)acrylate, decanyl (meth)acrylate, undecanyl (meth)acrylate, dodecyl (meth)acrylate, cyclohexyl (meth) acrylate, benzyl (meth)acrylate, phenyl (meth)acrylate, and the like; an unsaturated carboxylic acid amino alkyl ester such as 2-aminoethyl (meth)acrylate, 2-dimethylaminoethyl (meth)acrylate, and the like; a saturated or unsaturated carboxylic acid vinyl ester such as vinyl acetate, vinyl benzoate, and the like; a C1-C20 unsaturated carboxylic acid glycidyl ester such as glycidyl (meth)acrylate and the like; a vinyl cyanide compound such as (meth)acrylonitrile and the like; an unsaturated amide compound such as (meth)acrylamide and the like; a monofunctional or a polyfunctional (meth)acrylate of a monoalcohol or a polyhydric alcohol such as ethyleneglycol di(meth)acrylate, triethyleneglycol di(meth)acrylate, trimethylolpropane tri(meth)acrylate, 1,4-butanediol di(meth)acrylate, 1,6-hexanediol di(meth)acrylate, octanediol di(meth)acrylate, nonanediol di(meth)acrylate, decanediol di(meth)acrylate, undecanediol di(meth)acrylate, dodecanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, novolac epoxy (meth)acrylate, diethyleneglycol di(meth)acrylate, tri(propyleneglycol) di(meth)acrylate, poly(propyleneglycol) di(meth)acrylate, and the like, without being limited thereto. The 'polyhydric alcohol' may refer to an alcohol having two or more, about 2 to 20, preferably about 2 to 10, more preferably about 2 to 6 hydroxyl groups.

Preferably, the photocurable monomer may include at least one of a (meth)acrylate having a C1-C20 alkyl group, a di(meth)acrylate of a C2-C20 diol, a tri(meth)acrylate of a C3-C20 triol, and a tetra(meth)acrylate of a C4-C20 tetraol.

The photocurable monomer may be present in an amount of about 1 to 99 parts by weight based on 100 parts by weight of (A)+(B) in the photocurable composition. Preferably, the photocurable monomer may be present in an amount of about 20 to 95 parts by weight, more preferably about 30 to 95 parts by weight, still more preferably about 60 to 95 parts by weight. Within this range, the photocurable composition may exhibit strong resistance to plasma, thereby lowering or preventing outgas generation from plasma or water vapor transmission rate in manufacture of thin encapsulation layers.

(B) Silicon Containing Monomer

The silicon containing monomer may be a silicon type photocurable monomer which contains a silicon and has one or more photocurable functional groups (such as a (meth) acrylate group, a vinyl group, and the like). In one embodiment, the silicon containing monomer may be represented by Formula 1:

<Formula 1> wherein $X_1$, $X_2$ and $X_3$ are the same or different and are O, S, NH or NR'; R' is an unsubstituted or substituted C1-C20 alkyl group, $R_1$, $R_2$ and $R_3$ are the same or different and are an unsubstituted or substituted C1-C30 alkyl group, an unsubstituted or substituted C1-C30 alkylether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, or an unsubstituted or substituted C7-C30 arylalkoxy group, $Z_1$, $Z_2$, and $Z_3$ are the same or different and independently are hydrogen, an unsubstituted or substituted C1-C30 alkyl group, an unsubstituted or substituted C1-C30 alkylether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, an unsubstituted or substituted C7-C30 arylalkoxy group, or a group represented by Formula 2:

<Formula 2> wherein * represents a binding site for Si in Formula 1, $R_4$ is hydrogen, or a substituted or unsubstituted C1-C30 alkyl group, $R_5$ is a substituted or unsubstituted C1-C30 alkylene group, a substituted or unsubstituted C6-C30 arylene group, a substituted or unsubstituted C7-C30 arylalkylene group or a substituted or unsubstituted C1-C30 alkyleneoxy group; n is an integer from 1 to 30; and at least one of $Z_1$, $Z_2$, and $Z_3$ is the group represented by Formula 2).

n may be an integer from 1 to 30. Within this range, the water vapor transmission rate and outgas generation amount after curing of the composition can be lowered and photocuring rate of the composition can be increased.

Preferably, n may be an integer from about 1 to 10, more preferably from about 1 to 5.

$R_1$, $R_2$ and $R_3$ are preferably a C1-C10 alkyl group, more preferably a C1-C6 alkyl group.

$Z_1$, $Z_2$ and $Z_3$ are a group represented by Formula 2, wherein $R_4$ is hydrogen or a C1-C5 alkyl group.

$Z_1$, $Z_2$ and $Z_3$ are a group represented by Formula 2, wherein $R_5$ is a C1-C10 alkylene group, more preferably a C1-C5 alkylene group.

n may be preferably an integer from about 1 to 5, more preferably from about 1 to 3.

The silicon containing monomer may be commercially available or synthesized by any typical method.

The silicon containing monomer included in the photocurable composition together with the photocurable monomer can realize a layer, the water vapor transmission rate and outgas generation amount of which are remarkably reduced after curing the composition, thereby increasing photocuring rate. In addition, due to the presence of silicon, the silicon-containing monomer included in the organic barrier layer can minimize device damage due to plasma used for deposition of an inorganic barrier layer in an encapsulation structure wherein an inorganic barrier layer and an organic barrier layer are deposited.

The silicon containing monomer may be present in an amount of about 1 to 99 parts by weight based on 100 parts by weight of (A)+(B) of the photocurable composition. Preferably, the silicon-containing monomer may be present in an amount of about 5 to 80 parts by weight, more preferably about 5 to 70 parts by weight, still more preferably about 5 to 40 parts by weight. Within this range, the photocurable composition may exhibit strong resistance to plasma, thereby lowering or preventing outgas generation from plasma or water vapor transmission rate in preparation of thin encapsulation layers.

The composition may further include an initiator.

(C) Initiator

As an initiator, any conventional photo initiator may be used without limitation so long as the initiator allows photocurable reaction. For example, the photo initiator may include triazine, acetophenone, benzophenone, thioxanthone, benzoin, phosphorous, oxime initiators, and mixtures thereof.

Examples of the triazine initiators may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl (piperonyl)-6-triazine, 2,4-(trichloro methyl(4'-methoxystyryl)-6-triazine, and mixtures thereof.

Examples of the acetophenone initiators may include 2,2'-diethoxy acetophenone, 2,2'-dibutoxyacetophenone, 2-hydroxy-2-methylpropiophenone, p-t-butyl trichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholino propan-1-one, 2-benzyl-2-dimethylamino-1-(4-morpholinophenyl)-butan-1-one, and mixtures thereof.

Examples of the benzophenone initiators may include benzophenone, benzoyl benzoic acid, benzoyl benzoic acid methyl, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxy benzophenone, and mixtures thereof.

Examples of the thioxanthone initiators may include thioxanthone, 2-methylthioxanthone, isopropyl thioxanthone, 2,4-diethyl thioxanthone, 2,4-diisopropyl thioxanthone, 2-chlorothioxanthone, and mixtures thereof.

Examples of the benzoin initiators may include benzoin, benzoin methyl ether, benzoin ethyl ether, benzoin isopropyl ether, benzoin isobutyl ether, benzyl dimethyl ketal, and mixtures thereof.

Examples of the phosphorous initiators may include bis-benzoylphenyl phosphine oxide, benzoyldiphenyl phosphine oxide, and mixtures thereof.

Examples of the oxime initiators may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and mixtures thereof.

The initiator may be present in an amount of about 0.1 to 20 parts by weight based on 100 parts by weight of (A)+(B) in the photocurable composition. Within this range, photopolymerziation can be sufficiently performed under exposure to light and reduction in transmission owing to unreacted initiator remaining after photopolymerization can be prevented. Preferably, the initiator may be present in an amount of about 0.5 to 10 parts by weight, more preferably about 1 to 8 parts by weight.

The photocurable composition may include about 0.1 wt % to about 95 wt % of the (A) photocurable monomer, about 0.1 wt % to about 95 wt % of the (B) silicon containing monomer and about 0.1 wt % to about 10 wt % of the (C) initiator in terms of solid content. Preferably, the (A) photocurable monomer may be present in an amount of about 55 wt % to about 95 wt %, the (B) silicon containing monomer may be present in an amount of about 4 wt % to about 40 wt %, and the (C) initiator may be present in an amount of about 1 wt % to about 5 wt %.

The photocurable composition may exhibit a photocuring rate of about 90% or more. Within this range, curing shrinkage stress after curing is low, thereby realizing layers not generating any shift and enabling use in sealing applications. Preferably, the photocuring rate may be about 90% to 99%, for example about 93% to 96%.

The photocuring rate may be measured by a conventional method. For instance, the photocurable composition is coated onto a glass substrate and then subjected to curing at 100 mW/cm$^2$ for 10 seconds. The cured film is cut into specimens and the photocuring rate of each specimen is measured by means of FT-IR (fourier transform infrared spectroscopy). The photocuring rate is calculated under the conditions that are disclosed in the following Experimental Examples.

A member for an apparatus, particularly a member for a display apparatus, can suffer degradation or deterioration in quality by gas or liquid in surrounding environments, for example, atmospheric oxygen and/or water and/or vapor and by permeation of chemical materials used to process electronic products. To prevent this problem, the member for a display apparatus must be sealed or encapsulated.

Such members for an apparatus may include organic light emitting diodes (OLED), illumination devices, flexible organic light emitting diode displays, metal sensor pads, microdisc lasers, electrochromic devices, photochromic devices, microelectromechanical systems, solar cells, integrated circuits, charge coupled devices, light emitting polymers, light emitting diodes, and the like, without being limited thereto.

Since the photocurable composition has sufficient adhesion to the inorganic barrier layer, photocuring rate, and transmission rate, the photocurable composition may be used for formation of organic barrier layers to be used in sealing or encapsulation of the member for the apparatus, particularly flexible display apparatuses.

Another aspect of the present invention relates to an organic barrier layer which is formed of the composition.

The organic barrier layer may be formed by photocuring the photocurable composition. The photocurable composition may be coated to a thickness of about 0.1 μm to 20 μm and then cured through irradiation at about 10 to 500 mW/cm$^2$ for about 1 second to about 50 seconds, without being limited thereto.

The organic barrier layer may have physical properties of the photocurable composition after curing. Accordingly, the organic barrier layer may be used together with the inorganic barrier layer to form a barrier stack, which can be used in encapsulation of the member of the apparatus.

Yet another aspect of the present invention relates to a barrier stack including the organic barrier layer and the inorganic barrier layer.

The inorganic barrier layer differs from the organic barrier layer, and may supplement the effects of the organic barrier layer.

The inorganic barrier layer is not particularly limited so long as the barrier layer exhibits good light transmittance and good water vapor and/or oxygen-blocking barrier properties. For example, the inorganic barrier layer may be comprised of metal, intermetallic compounds or alloys, oxides of metals or mixed metals, fluorides of metals or mixed metals, nitrides of metals or mixed metals, metal carbides, oxygen nitrides of metals or mixed metals, borides of metals or mixed metals, oxygen borides of metals or mixed metals, silicides of metals or mixed metals, and mixtures thereof. The metals may include silicon (Si), aluminium (Al), selenium (Se), zinc (Zn), antimony (Sb), indium (In), germanium (Ge), tin (Sn), bismuth (Bi), a transition metal, a lanthanide metal, and the like, without being limited thereto. Specifically, the inorganic barrier layer may include silicon oxide, silicon nitride, silicon oxygen nitride, ZnSe, ZnO, $Sb_2O_3$, $Al_2O_3$, $In_2O_3$, or $SnO_2$.

The inorganic barrier layer and organic barrier layer may be deposited by vacuum processes, for example, by sputtering, chemical vapor deposition, plasma chemical vapor deposition, evaporation, sublimation, electrocyclone resonance-plasma vapor deposition, or combinations thereof.

The organic barrier layer may have the aforementioned properties. Thus, when the organic barrier layer is deposited alternately with the inorganic barrier layer, it is possible to secure smoothing properties of the inorganic barrier layer. In addition, the organic barrier layer is capable of preventing defect of the inorganic barrier layer from spreading to other inorganic barrier layers.

The organic barrier layer may exhibit little generation of outgas, thereby minimizing outgassing toward the member for the apparatus, which in turn prevents degradation and reduction in performance of the member for the apparatus due to the outgassing. Specifically, the organic barrier layer may have an outgas generation amount of about 1000 ppm or less. Within this range, the organic barrier layer may have an insignificant effect when applied to the member for the apparatus and ensures a very long lifespan of the member for the apparatus. For example, the outgas generation amount may be about 10 ppm to about 1000 ppm, for example about 200 ppm to about 750 ppm.

The outgas generation amount of the organic barrier layer can be measured by any typical method. For example, the photocurable composition is coated onto a glass substrate and then subjected to UV curing by UV irradiation at 100 mW/cm$^2$ for 10 seconds to produce an organic barrier layer specimen having a size of 20 cm×20 cm×3 in (width× length×thickness). By using the specimen, the outgas generation amount of the organic barrier layer is determined under the conditions prescribed in Experimental Examples below.

Furthermore, the organic barrier layer may have low water vapor transmission rate so that the effect of water vapor on the devices can be minimized. The organic barrier layer may have water vapor transmission rate of about 4.5 g/m$^2$·24 hr or less in the thickness direction of the organic barrier layer. Within this range, the organic barrier layer can be used to encapsulate devices. For example, the organic barrier layer has a water vapor transmission rate of about 1.0 to 4.5 g/m$^2$·24 hr, for example about 2.1 to 4.1 g/m$^2$·24 hr.

The water vapor transmission rate may be measured by any typical method. For example, a water vapor transmission rate tester (PERMATRAN-W 3/33, manufactured by MOCON) was employed. The photocurable composition was coated onto an Al sample holder and subjected to UV curing by UV irradiation at 100 mW/cm$^2$ for 10 seconds to produce a cured specimen having a 5 µm thick layer. A water vapor transmission rate was measured at 37.8° C. and 100% relative humidity for 24 hours at a layer thickness of 5 µm.

The barrier stack may include the organic barrier layer and the inorganic barrier layer. Here, the number of barrier stacks is not particularly limited. The combination of the barrier stacks may be modified depending on the degree of resistance to permeation of oxygen and/or water vapor and/or vapor and/or chemical materials.

In the barrier stack, the organic barrier layer and the inorganic barrier layer may be alternately deposited. This is because such deposition provides a favorable effect on the organic barrier layer due to physical properties of the composition. For this reason, the organic barrier layer and inorganic barrier layer may supplement or reinforce the encapsulation effect on the apparatus.

Preferably, total 10 layers or less (e.g., about 2 to 10 layers), more preferably 7 layers or less (e.g., about 2 to 7 layers) of the organic barrier layer and the inorganic barrier layer are alternately deposited.

In the barrier stack, each of the organic barrier layer may have a thickness of about 0.1 µm to 20 µm, preferably about 1 µm to 10 µm. Each of the inorganic barrier layer may have a thickness of about 5 nm to 500 nm, preferably about 5 nm to 200 nm.

The barrier stack is a thin-film encapsulation material and has a thickness of about 5 µm or less, preferably about 1.5 µm to 5 µm.

Yet another aspect of the present invention relates to an encapsulated apparatus including a member for the apparatus and a barrier layer or a barrier stack. The apparatus is not limited so long as the apparatus includes a member for the apparatus, for example a display apparatus.

The encapsulated apparatus may include a member for the apparatus and a barrier stack formed on the member for the apparatus and including an inorganic barrier layer and an organic barrier layer.

Figure 1:
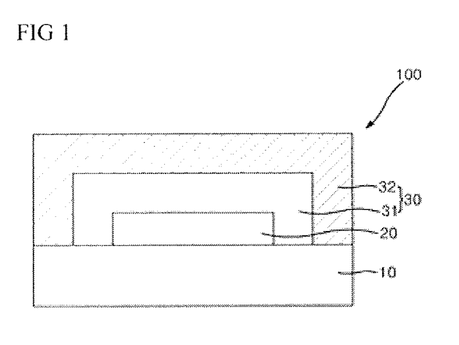
FIG. 1 is a cross sectional view of an encapsulated apparatus according to one embodiment of the present invention.
Figure 2:
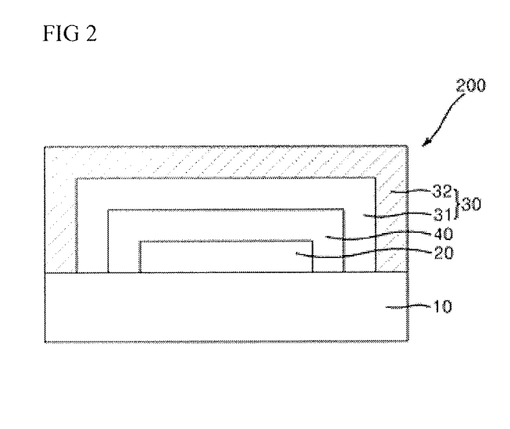
FIG. 2 is a cross sectional view of an encapsulated apparatus according to another embodiment of the present invention.

FIGS. 1 and 2 are sectional views of encapsulated apparatuses according to embodiments of the present invention.

Referring to FIG. 1, an encapsulated apparatus 100 includes a substrate 10, a member 20 (for example, organic light emitting diode) for the apparatus formed on the substrate 10, and a barrier stack 30 formed on the member 20 and including an inorganic barrier layer 31 and an organic barrier layer 32.

Referring to FIG. 2, an encapsulated apparatus 200 includes a substrate 10, a member 20 (for example, organic light emitting diode) for the apparatus formed on the substrate 10, and a barrier stack 30 formed on the member 20 and including an inorganic barrier layer 31 and an organic barrier layer 32.

FIG. 1 shows one embodiment in which the member 20 for the apparatus contacts the inorganic barrier layer 31. FIG. 2 shows one embodiment in which a vacant space 40 is formed between the member 20 for the apparatus and the inorganic barrier layer 31.

Details of the member for the apparatus, organic barrier layer, inorganic barrier layer and barrier stack have been set forth above.

The substrate is not particularly limited so long as it allows the member for the apparatus to be stacked thereon. Examples of the substrate may include transparent glass, plastic sheets, silicone or metal substrates, and the like.

Depending on kinds of the member for the apparatus, the substrate may be omitted.

The encapsulated apparatus may be produced by any typical method. The member for the apparatus is deposited on a substrate and then an inorganic barrier layer is formed thereon. The photocurable composition is coated by spin coating, slit coating, and the like, and light is irradiated thereto to form an organic barrier layer. The procedures for forming the inorganic barrier layer and the organic barrier layer may be repeated.

The method for forming the inorganic barrier layer and organic barrier layer is not particularly limited, and may include a deposition procedure.

Yet another aspect of the present invention relates to a method for encapsulating the member for the apparatus. The method includes: stacking at least one member for the apparatus on a substrate; and forming at least one barrier stack including at least one inorganic barrier layer and one organic barrier layer wherein the barrier stack is adjacent to the member for the apparatus.

Details of the substrate, member for the apparatus, inorganic barrier layer, organic barrier layer and barrier stack have been set forth above.

The member for the apparatus may be stacked on the substrate. The stacking may be performed in the same manner as the method for forming the inorganic barrier layer and organic barrier layer below, without being limited thereto.

The inorganic barrier layer and the organic barrier layer may be formed by vacuum processes, for example, by sputtering, chemical vapor deposition, plasma chemical vapor deposition, evaporation, sublimation, electrocyclone resonance-plasma vapor deposition, or combinations thereof.

MODE FOR INVENTION

Next, the present invention will be explained in more detail with reference to some examples. These examples are provided for illustration only and are not to be construed in any way as limiting the present invention.

Preparation Example 1

Preparation of Silicon Containing Monomer 1 (Formula 3)

To a 500 ml flask equipped with a cooling tube and a stirrer, 200 ml of 1,2-dichloroethane was added and then 63 g of allyl methacrylate (Aldrich), 27 g of 1,3,5-trimethylcyclotrisiloxane and 0.01 g of platinum-1,3-divinyl-1,1,3,3-tetramethyldisiloxane complex solution (Aldrich) were introduced. The flask was purged with nitrogen while stirring at 40° C. for 8 hours. After the reaction, 1,2-dichloroethane was distilled off under reduced pressure and then 45 g of a compound represented by Formula 3 was obtained through silica gel column chromatography. Purity of the obtained compound was 98%, as determined via HPLC.

<Formula 3>

Preparation Example 2

Preparation of Silicon Containing Monomer 2 (Formula 4)

A silicon containing monomer 2 was prepared by conducting the reaction in the same manner as in Preparation Example 1 except that 1,3,5,7-tetramethylcyclotetrasiloxane was used instead of 1,3,5-trimethylcyclotrisiloxane.

<Formula 4>

Details of components used in Examples and Comparative Examples are as follows:

(A) Photocurable monomer: (A1) Hexyl acrylate, (A2) Hexanediol diacrylate, (A3) Pentaerythritol tetraacrylate (Aldrich)

(B) Silicon containing monomer: (B1) Monomer of Formula 3, (B2) Monomer of Formula 4

(C) Initiator: Darocur TPO (BASF)

Examples and Comparative Examples

The (A) photocurable monomer, (B) silicon containing monomer and (C) initiator were placed in amounts as listed in Table 2 (unit: parts by weight) to a 125 ml brown polypropylene bottle, followed by mixing using a shaker for 3 hours to prepare compositions.

The compositions produced in Examples and Comparative Examples were evaluated as to physical properties. Results are shown in Table 2.

Evaluation of Physical Properties

1. Water vapor transmission rate: A water vapor transmission rate tester (PERMATRAN-W 3/33, manufactured by MOCON) was employed. The photocurable composition was spray-coated onto an Al sample holder and subjected to UV curing by UV irradiation at 100 mW/cm$^2$ for 10 seconds to produce a cured specimen having a 5 μm thick layer. A water vapor transmission rate was measured using the water vapor transmission rate tester (PERMATRAN-W 3/33, manufactured by MOCON) at 37.8° C. and 100% relative humidity for 24 hours at a layer thickness of 5 μm.

2. Outgas generation amount of organic barrier layer: The photocurable composition was spray-coated onto a glass substrate and then subjected to UV curing by UV irradiation at 100 mW/cm$^2$ for 10 seconds to produce an organic barrier layer specimen having a size of 20 cm×20 cm×3 μm (width×length×thickness). A GC/MS tester (Clarus 600, Perkin Elmer) was used to measure outgas generation. GC/MS utilized a DB-5MS column (length: 30 m, diameter: 0.25 mm, thickness of fixed phase: 0.25 μm), and helium gas (flow rate: 1.0 mL/min, average velocity=32 cm/s) as a mobile phase. Further, the split ratio was 20:1 and temperature was set such that temperature was maintained at 40° C. for 3 minutes, warmed at a rate of 10° C./minute, and then maintained at 320° C. for 6 minutes. Outgas was collected under a glass size of 20 cm×20 cm, the collection container was a Tedlar bag, the collection temperature was 90° C., the collection time was 30 minutes, $N_2$ purging was conducted at a flow rate of 300 mL/minute and the adsorbent was Tenax GR (5% phenylmethyl polysiloxane). A calibration curve was plotted using a toluene in n-hexane solution in concentrations of 150 ppm, 400 ppm and 800 ppm as a standard solution, wherein R2 value was obtained as 0.9987. The conditions mentioned above may be summarized in Table 1.

TABLE 1

| Conditions | Details | |
|---|---|---|
| Collection conditions | Glass size: 20 cm × 20 cm | |
| | Collection container: Tedlar bag | |
| | Collection temperature: 90° C. | |
| | Collection time: 30 min | |
| | $N_2$ purge flow rate: 300 mL/min | |
| | Adsorbent: Tenax GR | |
| Conditions for plotting calibration curve | Standard solution: Toluene in n-Hexane | |
| | Concentration range: 150 ppm, 400 ppm, 800 ppm | |
| | R2: 0.9987 | |
| GC/MS conditions | GC/MS Column | DB-5MS→30 m × 0.25 mm × 0.25 μm (5% phenylmethyl polysiloxane) |
| | GC/MS Mobile phase | He |
| | GC/MS Flow | 1.0 mL/min (Average velocity = 32 cm/s) |
| | GC/MS Split | Split ratio = 20:1 |
| | GC/MS Method | 40° C. (3 min) – 10° C./min→ 320° C. (6 min) |

3. Photocuring rate: The intensity of absorption peaks for the photocurable composition was measured using FT-IR (NICOLET 4700, Thermo) at near 1635 cm$^{-1}$ (C=C) and 1720 cm$^{-1}$ (C=O). First, the photocurable composition was spray-coated onto a glass substrate and then subjected to UV curing by UV irradiation at 100 mW/cm$^2$ for 10 seconds to produce a specimen having a size of 20 cm×20 cm×3 μm (width×length×thickness). The cured film was cut into specimens, which in turn were used to measure intensity of absorption peaks at 1635 cm$^{-1}$ (C=C) and 1720 cm$^{-1}$ (C=O) using FT-IR (NICOLET 4700, by Thermo). The photocuring rate was calculated by Equation 1:

$$\text{Photocuring rate (\%)} = |1-(A/B)| \times 100, \quad \text{<Equation 1>}$$

wherein A is a ratio of intensity of absorption peak at near 1635 cm$^{-1}$ to intensity of absorption peak at near 1720 cm$^{-1}$ on the cured film, and B is a ratio of intensity of absorption peak at near 1635 cm$^{-1}$ to intensity of absorption peak at near 1720 cm$^{-1}$ on the photocurable composition.

TABLE 2

| | | Example | | | | | | | | Comparative Example | | |
|---|---|---|---|---|---|---|---|---|---|---|---|---|
| | | 1 | 2 | 3 | 4 | 5 | 6 | 7 | 8 | 1 | 2 | 3 |
| A | A1 | 20 | 20 | 20 | 20 | 20 | 20 | 20 | 20 | 20 | 20 | 20 |
| | A2 | 40 | 60 | 70 | 70 | 40 | 60 | 70 | 70 | 40 | 60 | 70 |
| | A3 | — | — | — | 5 | — | — | — | 5 | 40 | 20 | 10 |
| B | B1 | 40 | 20 | 10 | 5 | — | — | — | — | — | — | — |
| | B2 | — | — | — | — | 40 | 20 | 10 | 5 | — | — | — |
| C | | 5 | 5 | 5 | 5 | 5 | 5 | 5 | 5 | 5 | 5 | 5 |
| Water vapor Transmission rate (g/m$^2$ · 24 hr) | | 2.1 | 2.3 | 3.2 | 4.1 | 2.6 | 2.8 | 3.1 | 3.9 | 6.9 | 7.5 | 9.9 |
| Outgas generation amount (ppm) | | 210 | 280 | 430 | 740 | 190 | 180 | 240 | 320 | 1290 | 1540 | 2980 |
| Photocuring rate (%) | | 94.3 | 95.6 | 96 | 93 | 96.3 | 96.6 | 96.3 | 96.5 | 82 | 88 | 89 |

As shown in Table 2, the layers produced from the photocurable compositions of the present invention demonstrated low water vapor transmission rate and significantly reduced outgassing, as compared to Comparative Examples. In addition, the photocurable composition of the present invention demonstrated a significantly high photocuring rate as compared to Comparative Examples.

Meanwhile, the layers produced from the photocurable compositions of Comparative Examples 1-3 which do not contain the silicon containing monomer demonstrated high water vapor transmission rate, high outgassing, and relatively low photocuring rate, thereby preventing the layers from realizing the effects of the present invention.

It should be understood by those skilled in the art that the present invention is not limited by the aforementioned embodiments and the drawings, and that various modifications, changes, and alterations can be made without departing from the spirit and scope of the invention. Therefore, these embodiments are provided for illustration only and are not to be construed in any way as limiting the present invention.

The invention claimed is:

1. A photocurable composition, comprising:
   (A) a photocurable monomer; and
   (B) a silicon containing monomer, wherein the (B) silicon containing monomer is represented by Formula 1:

<Formula 1> wherein X₁, X₂, and X₃ are the same or different, and are independently O, S, NH, or NR', R' being an unsubstituted or substituted C1-C20 alkyl group;

R₁, R₂, and R₃ are the same or different, and are independently an unsubstituted or substituted C1-C30 alkyl group, an unsubstituted or substituted C1-C30 alkyl ether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, or an unsubstituted or substituted C7-C30 arylalkoxy group;

Z₁, Z₂, and Z₃ are the same or different, and are independently hydrogen, an unsubstituted or substituted C1-C30 alkyl group, an unsubstituted or substituted C1-C30 alkyl ether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, an unsubstituted or substituted C7-C30 arylalkoxy group, or a group represented by Formula 2:

<Formula 2> wherein:

* represents a binding site for Si in Formula 1;

R₄ is hydrogen, or a substituted or unsubstituted C1-C30 alkyl group, R₅ is a substituted or unsubstituted C1-C30 alkylene group, a substituted or unsubstituted C6-C30 arylene group, a substituted or unsubstituted C7-C30 arylalkylene group, or a substituted or unsubstituted C1-C30 alkyleneoxy group;

n is an integer from 1 to 30;

at least one of Z₁, Z₂, and Z₃ is the group represented by Formula 2, and the (A) photocurable monomer includes one or more of a (meth)acrylate having a C1-C20 alkyl group, a di(meth)acrylate of a C2-C20 diol, a tri(meth)acrylate of a C3-C20 triol, or a tetra(meth)acrylate of a C4-C20 tetraol, the composition including about 60 to about 95 parts by weight of the (A) photocurable monomer and about 5 to about 40 parts by weight of the (B) silicon containing monomer based on 100 parts by weight of (A)+(B).

2. The photocurable composition according to claim 1, wherein the (B) silicon containing monomer includes Formula 3, Formula 4, or a mixture thereof:

<Formula 3>

<Formula 4>

3. The photocurable composition according to claim 1, wherein the photocurable monomer includes a monomer having 1 to about 30 substituted or unsubstituted vinyl groups, a monomer having 1 to about 30 substituted or unsubstituted acrylate groups, a monomer having 1 to about 30 substituted or unsubstituted methacrylate groups, or a mixture thereof.

4. The photocurable composition according to claim 1, comprising:
about 1 to 99 parts by weight of the (A) photocurable monomer and about 1 to 99 parts by weight of the (B) silicon containing monomer based on 100 parts by weight of (A)+(B).

5. The photocurable composition according to claim 1, further comprising:
(C) an initiator.

6. The photocurable composition according to claim 5, wherein the (C) initiator comprises a photoinitiator.

7. The photocurable composition according to claim 5, comprising:

about 1 part by weight to about 99 parts by weight of the (A) photocurable monomer and about 1 part by weight to about 99 parts by weight of the (B) silicon containing monomer based on 100 parts by weight of (A)+(B); and about 0.1 parts by weight to about 20 parts by weight of the (C) initiator based on 100 parts by weight of (A)+(B).

8. A member for an apparatus encapsulated with the photocurable composition according to claim 1.

9. An encapsulated apparatus, comprising:
a member for the apparatus and a barrier stack formed on the member for the apparatus, the barrier stack including an inorganic barrier layer and an organic barrier layer, the organic barrier layer having an outgas generation amount of about 1000 ppm or less and including a cured product of a photocurable composition, the photocurable composition including:
(A) a photocurable monomer; and
(B) a silicon containing monomer, wherein the (B) silicon containing monomer is represented by Formula 1:

<Formula 1> wherein:
$X_1$, $X_2$, and $X_3$ are the same or different, and are independently O, S, NH, or NR', R' being an unsubstituted or substituted C1-C20 alkyl group;
$R_1$, $R_2$, and $R_3$ are the same or different, and are independently an unsubstituted or substituted C1-C30 alkyl group, an unsubstituted or substituted C1-C30 alkyl ether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, or an unsubstituted or substituted C7-C30 arylalkoxy group;
$Z_1$, $Z_2$, and $Z_3$ are the same or different, and are independently hydrogen, an unsubstituted or substituted C1-C30 alkyl group, an unsubstituted or substituted C1-C30 alkyl ether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, an unsubstituted or substituted C7-C30 arylalkoxy group, or a group represented by Formula 2:

<Formula 2> wherein:
* represents a binding site for Si in Formula 1;
$R_4$ is hydrogen, or a substituted or unsubstituted C1-C30 alkyl group, $R_5$ is a substituted or unsubstituted C1-C30 alkylene group, a substituted or unsubstituted C6-C30 arylene group, a substituted or unsubstituted C7-C30 arylalkylene group, or a substituted or unsubstituted C1-C30 alkyleneoxy group;
n is an integer from 1 to 30;
at least one of $Z_1$, $Z_2$, and $Z_3$ is the group represented by Formula 2, and
the (A) photocurable monomer includes one or more of a (meth)acrylate having a C1-C20 alkyl group, a di(meth)acrylate of a C2-C20 diol, a tri(meth)acrylate of a C3-C20 triol, or a tetra(meth)acrylate of a C4-C20 tetraol,
the composition including about 60 to about 95 parts by weight of the (A) photocurable monomer and about 5 to about 40 parts by weight of the (B) silicon containing monomer based on 100 parts by weight of (A)+(B).

10. The encapsulated apparatus according to claim 9, wherein the organic barrier layer and the inorganic barrier layer are alternately deposited in the barrier stack.

11. The encapsulated apparatus according to claim 9, wherein the organic barrier layer and the inorganic barrier layer are deposited to a total of about 10 layers or less in the barrier stack.

12. The encapsulated apparatus according to claim 9, wherein the organic barrier layer has a thickness of about 0.1 μm to about 20 μm and the inorganic barrier layer has a thickness of about 5 nm to about 500 nm.

13. The encapsulated apparatus according to claim 9, wherein the inorganic barrier layer includes a metal, a metal oxide, a metal nitride, a metal carbide, a metal oxygen nitride, a metal oxygen boride, or a mixture thereof, and wherein the metal is at least one of silicon (Si), aluminum (Al), selenium (Se), zinc (Zn), antimony (Sb), indium (In), germanium (Ge), tin (Sn), bismuth (Bi), a transition metal, and a lanthanide metal.

14. The encapsulated apparatus according to claim 9, wherein the (B) silicon containing monomer includes Formula 3, Formula 4, or a mixture thereof:

<Formula 3>

<Formula 4>

15. An encapsulated apparatus, comprising:
a member for the apparatus and a barrier stack formed on the member for the apparatus, the barrier stack including an inorganic barrier layer and an organic barrier layer, the organic barrier layer having a water vapor transmission rate of about 4.5 g/m²·24 hr or less, as measured at 37.8° C. and 100% relative humidity for 24 hours at a layer thickness of 5 μm in a thickness direction, and including a cured product of a photocurable composition, the photocurable composition including:
(A) a photocurable monomer; and
(B) a silicon containing monomer, wherein the (B) silicon containing monomer is represented by Formula 1:

<Formula 1> wherein:
$X_1$, $X_2$, and $X_3$ are the same or different, and are independently O, S, NH, or NR', R' being an unsubstituted or substituted C1-C20 alkyl group;

$R_1$, $R_2$, and $R_3$ are the same or different, and are independently an unsubstituted or substituted C1-C30 alkyl group, an unsubstituted or substituted C1-C30 alkyl ether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, or an unsubstituted or substituted C7-C30 arylalkoxy group;

$Z_1$, $Z_2$, and $Z_3$ are the same or different, and are independently hydrogen, an unsubstituted or substituted C1-C30 alkyl group, an unsubstituted or substituted C1-C30 alkyl ether group, an unsubstituted or substituted C1-C30 monoalkylamine group or dialkylamine group, an unsubstituted or substituted C1-C30 monoalkylsulfide group or dialkylsulfide group, an unsubstituted or substituted C6-C30 aryl group, an unsubstituted or substituted C7-C30 arylalkyl group, an unsubstituted or substituted C1-C30 alkoxy group, an unsubstituted or substituted C7-C30 arylalkoxy group, or a group represented by Formula 2:

<Formula 2> wherein:
* represents a binding site for Si in Formula 1;
$R_4$ is hydrogen, or a substituted or unsubstituted C1-C30 alkyl group, $R_5$ is a substituted or unsubstituted C1-C30 alkylene group, a substituted or unsubstituted C6-C30 arylene group, a substituted or unsubstituted C7-C30 arylalkylene group, or a substituted or unsubstituted C1-C30 alkyleneoxy group;
n is an integer from 1 to 30;
at least one of $Z_1$, $Z_2$, and $Z_3$ is the group represented by Formula 2, and
the (A) photocurable monomer includes one or more of a (meth)acrylate having a C1-C20 alkyl group, a di(meth)acrylate of a C2-C20 diol, a tri(meth)acrylate of a C3-C20 triol, or a tetra(meth)acrylate of a C4-C20 tetraol,
the composition including about 60 to about 95 parts by weight of the (A) photocurable monomer and about 5 to about 40 parts by weight of the (B) silicon containing monomer based on 100 parts by weight of (A)+(B).

* * * * *